United States Patent
Wang (10) Patent No.: US 8,691,680 B2
(45) Date of Patent: Apr. 8, 2014

(54) METHOD FOR FABRICATING MEMORY DEVICE WITH BURIED DIGIT LINES AND BURIED WORD LINES

(75) Inventor: Kuo-Chen Wang, Chiayi (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 298 days.

(21) Appl. No.: 13/182,450

(22) Filed: Jul. 14, 2011

(65) Prior Publication Data

US 2013/0015551 A1 Jan. 17, 2013

(51) Int. Cl.
*H01L 21/4763* (2006.01)

(52) U.S. Cl.
USPC .......................................... 438/589

(58) Field of Classification Search
None
See application file for complete search history.

(56) References Cited

U.S. PATENT DOCUMENTS

| | | | |
|---|---|---|---|
| 7,285,812 B2* | 10/2007 | Tang et al. | 257/296 |
| 8,030,211 B2* | 10/2011 | Aritome | 438/672 |
| 2009/0097317 A1* | 4/2009 | Willer et al. | 365/185.17 |
| 2009/0302380 A1* | 12/2009 | Graf et al. | 257/330 |
| 2010/0097835 A1* | 4/2010 | Popp et al. | 365/63 |
| 2011/0084320 A1* | 4/2011 | Jung | 257/288 |
| 2011/0183507 A1* | 7/2011 | Figura et al. | 438/589 |
| 2011/0198758 A1* | 8/2011 | Jeon et al. | 257/774 |
| 2012/0280296 A1* | 11/2012 | Baars et al. | 257/296 |

* cited by examiner

*Primary Examiner* — Charles Garber
*Assistant Examiner* — Andre' C Stevenson
(74) *Attorney, Agent, or Firm* — Winston Hsu; Scott Margo (57) ABSTRACT

A method for fabricating a memory array includes providing a semiconductor substrate having thereon a plurality of line-shaped active areas and intermittent line-shaped trench isolation regions between the plurality of line-shaped active areas, which extend along a first direction; forming buried word lines extending along a second direction in the semiconductor substrate, the buried word lines intersecting with the line-shaped active areas and the intermittent line-shaped trench isolation regions, wherein the second direction is not perpendicular to the first direction; forming buried digit lines extending along a third direction in the semiconductor substrate, wherein the third direction is substantially perpendicular to the second direction; and forming storage nodes at storage node sites between the buried digit lines.

14 Claims, 10 Drawing Sheets

METHOD FOR FABRICATING MEMORY DEVICE WITH BURIED DIGIT LINES AND BURIED WORD LINES

BACKGROUND OF THE INVENTION

1. Field of the Invention

The present invention relates generally to the field of integrated circuit fabrication. More particularly, the present invention relates to a method of fabricating a memory array, such as a memory array of a stack-type DRAM device.

2. Description of the Prior Art

Electronic storage devices such as dynamic random access memory (DRAM) have been an essential resource for the retention of data. Conventional semiconductor DRAM typically incorporate capacitor and transistor structures in which the capacitors temporarily store data based on the charged state of the capacitor structure. In general, this type of semiconductor memory often requires densely packed capacitor structures that are easily accessible for electrical interconnection.

The capacitor and transistor structures are generally known as memory cells. The memory cells are arranged into memory arrays. The memory cells are addressed via a word line and a digit line, one of which addresses a "column" of memory cells while the other addresses a "row" of memory cells.

Recently, there has been increasing research on the buried word line cell array transistor in which a word line is buried in a semiconductor substrate below the top surface of the substrate using a metal as a gate conductor. In such a memory device, the bit line or digit line is often fabricated over the surface of the semiconductor substrate. Therefore, an additional storage node contact or "cell contact" is required for the interconnection between the storage node and the active area of the semiconductor substrate.

However, storage node contact process involves several complicated steps. Furthermore, as integrated circuit designs become denser, it becomes more difficult to isolate a digit line from the adjacent cell contact in the array. Thus, shorting between cell contact and digit line or between cell contact and cell contact may occur.

SUMMARY OF THE INVENTION

It is one object of the present invention to provide an improved method of fabricating a memory array in order to solve the above-described prior art problems or shortcomings.

According to one embodiment of the invention, a method for fabricating a memory array includes providing a semiconductor substrate having thereon a plurality of line-shaped active areas and intermittent line-shaped trench isolation regions between the plurality of line-shaped active areas, which extend along a first direction; forming buried word lines extending along a second direction in the semiconductor substrate, the buried word lines intersecting with the line-shaped active areas and the intermittent line-shaped trench isolation regions, wherein the second direction is not perpendicular to the first direction; forming buried digit lines extending along a third direction in the semiconductor substrate, wherein the third direction is substantially perpendicular to the second direction; and forming storage nodes at storage node sites between the buried digit lines.

The step of forming buried digit lines extending along a third direction in the semiconductor substrate may comprise recessing line-shaped buried digit line trenches into the semiconductor substrate; blanket depositing a liner over the semiconductor substrate; removing a portion of the liner from where the line-shaped buried digit line trenches intersecting with the line-shaped active areas; depositing a conductive layer into the line-shaped buried digit line trenches; and capping the conductive layer by a dielectric cap layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1-6 are schematic diagrams illustrating a method for fabricating a memory device with buried digit lines and buried word lines integrated in the memory array of the memory device in accordance with one embodiment of the present invention, wherein FIGS. 1A-6A are top views of schematic layout diagrams of memory array of the memory device in different manufacturing stages according to an exemplary embodiment of the invention;

FIGS. 1B-5B and 1C-5C are schematic, cross-sectional views taken along lines I-I' and II-II', respectively, in the layout diagrams depicted in FIGS. 1A-5A;

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of the invention. In the drawings, the thicknesses of layers and regions may be exaggerated for clarity.

Figure 1A:
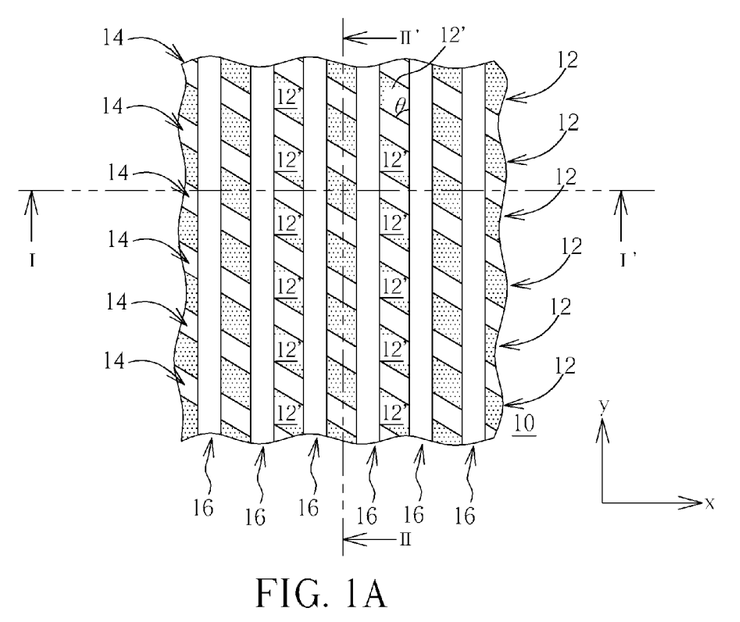
Figure 1B:
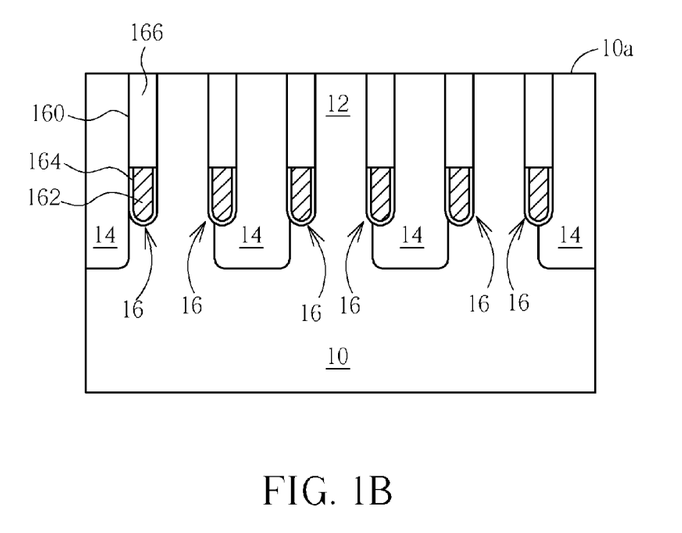
Figure 1C:
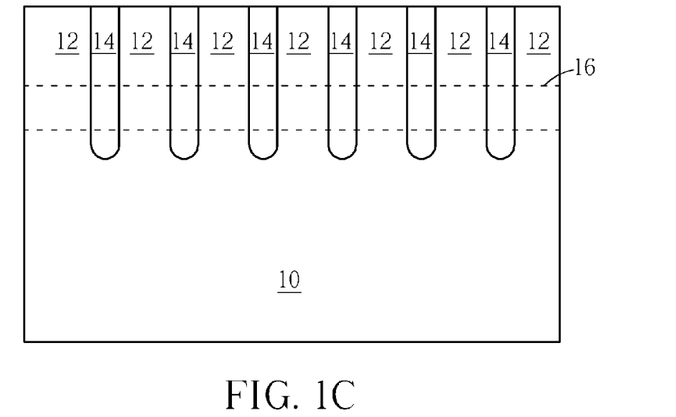

Referring now to FIGS. 1A, 1B and 1C. FIG. 1A is a top view of the schematic layout of the memory array of the memory device after the formation of columns of buried word lines (BWL) according to one embodiment of the invention. FIGS. 1B and 1C are schematic, cross-sectional views taken along line I-I' and II-II', respectively, in FIG. 1A. First, a semiconductor substrate 10, such as bulk silicon, like a silicon wafer, is provided. A pad layer (not shown) such as silicon oxide or silicon nitride may be formed over the substrate 10. A plurality of continuous line-shaped active areas 12 are formed in the substrate 10. As shown in FIGS. 1A and 1C, a plurality of line-shaped shallow trench isolation (STI) structures 14 are provided between the plurality of line-shaped active areas 12 to isolate the line-shaped active areas 12 from one another. The formation of the STI structures 14 is known in the art. For example, using conventional lithographic processes, a photoresist pattern (not shown) may be formed on the substrate 10, which defines line-shaped trench patterns to be etched into the substrate 10. Using the photoresist pattern as a hard mask, a dry etching process is performed to etch the substrate 10 to thereby form a plurality of trenches. The trenches are then filled with insulating materials such as silicon oxide.

After the formation of the STI structures 14 and the active areas 12, columns of line-shaped buried word lines 16 are fabricated in the substrate 10. As can be seen in FIG. 1A, the columns of line-shaped buried word lines 16 extend along a reference y-axis and intersect with the intermittent line-shaped active areas 12 and line-shaped STI structures 14 at an angle θ, which is preferably between 15° and 60°, but should not be limited thereto. A plurality of AA landing areas 12' are defined intermittently along each of the line-shaped active areas 12. As best seen in FIG. 1B, each of the buried word lines 16 is embedded at a lower portion of a word line trench 160. Each of the buried word lines 16 may be composed of conductor 162, which may comprise a single layer of metal, metal composite or layers of conductive materials. The conductor 162 is encapsulated by an insulating layer 164 lining the lower surface of the word line trench 160 and a cap layer 166. The cap layer 166 has a top surface that is flush with a top surface 10a of the substrate 10.

For example, the conductor 162 may be formed of anyone selected from the group consisting of titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof. The conductor 162 may be formed using a chemical vapor deposition (CVD) or an atomic layer deposition (ALD) method. After depositing the conductor 162, an etching process may be performed to recess the buried word lines 16 into the substrate 10.

Figure 2A:
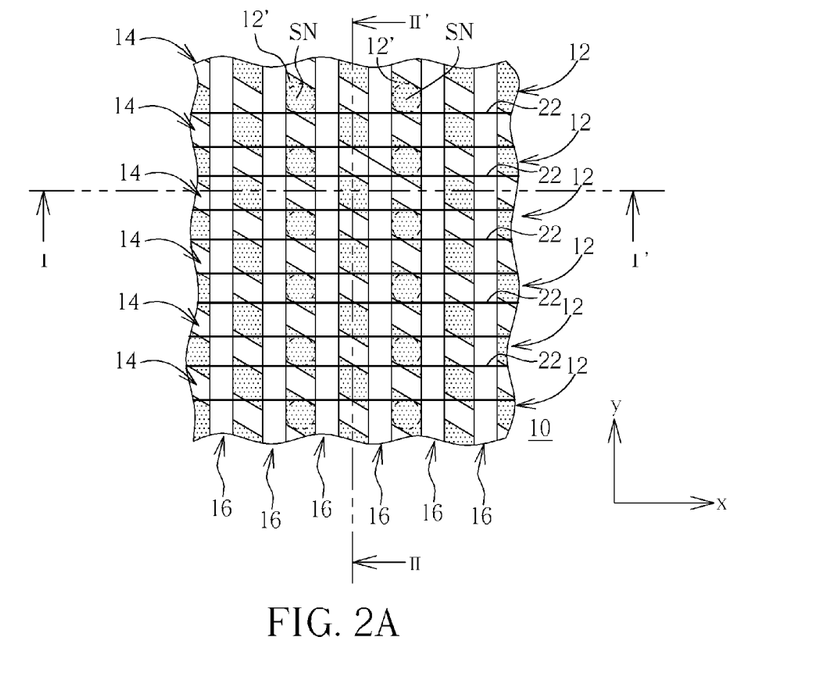
Figure 2B:
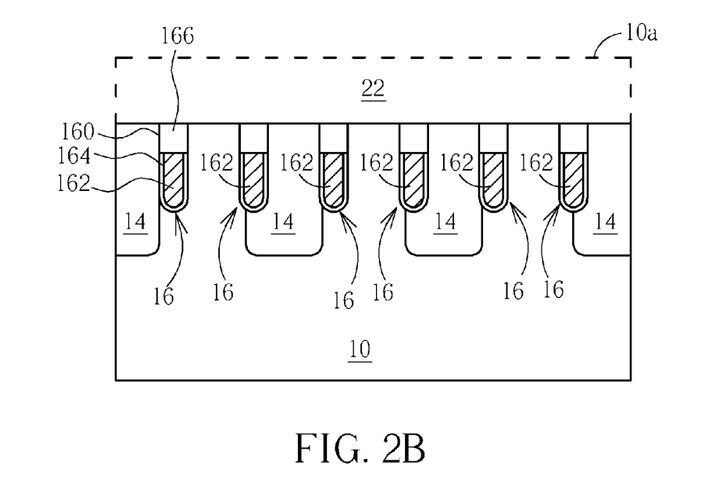
Figure 2C:
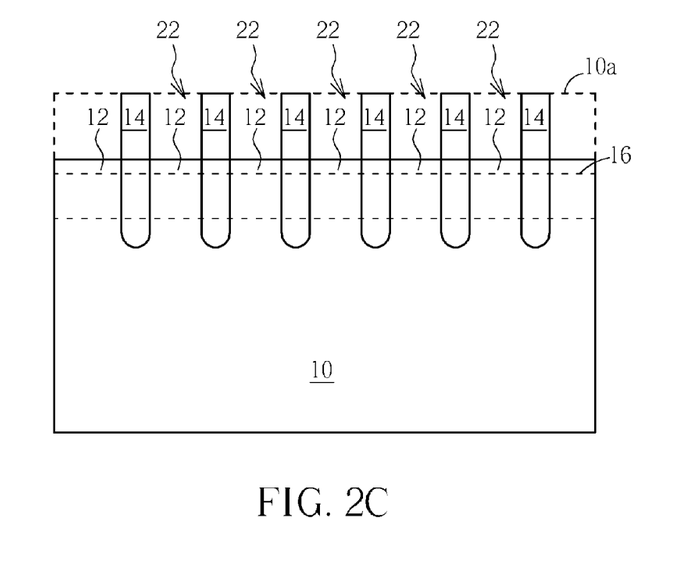

Referring now to FIGS. 2A, 2B and 2C. FIG. 2A is a top view of the schematic layout of the memory array of the memory device after the formation of buried digit line (BDL) trenches according to an exemplary embodiment of the invention. FIGS. 2B and 2C are schematic, cross-sectional views taken along lines I-I' and II-II', respectively, in FIG. 2A. As shown in FIG. 2A, rows of buried digit line trenches 22 are formed and are recessed into the top surface 10a of the substrate 10. The rows of BDL trenches 22 extend along the reference x-axis and intersect with the intermittent line-shaped active areas 12 and line-shaped STI structures 14 at an angle that is not 90°. As shown in FIG. 2B, the depth of each of the etched BDL trenches 22 is well controlled such that the conductors 162 of the buried word lines 16 are not exposed. In FIG. 2A, a storage node is to be formed and landed at the corresponding SN site (denoted by "SN" and indicated with broken circular line pattern), which is roughly the exposed active area between two BDL trenches 22.

Figure 3A:
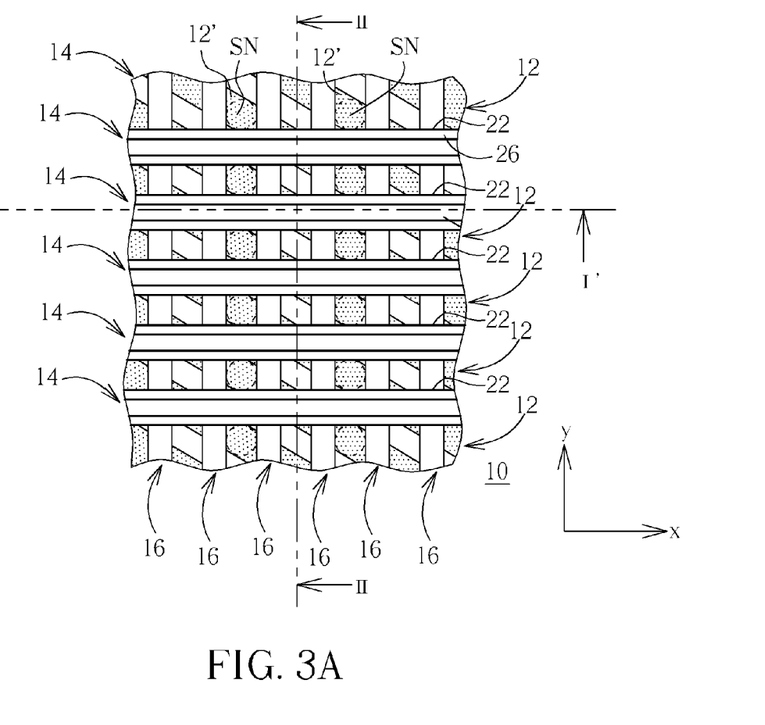
Figure 3B:
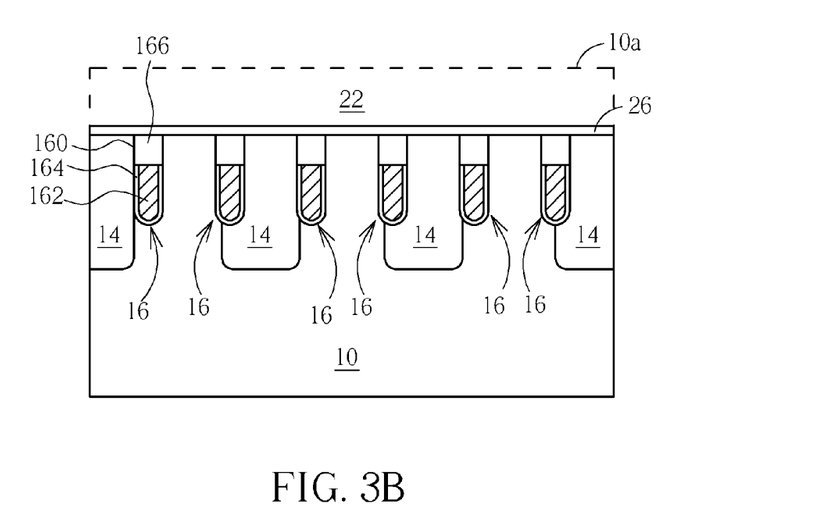
Figure 3C:
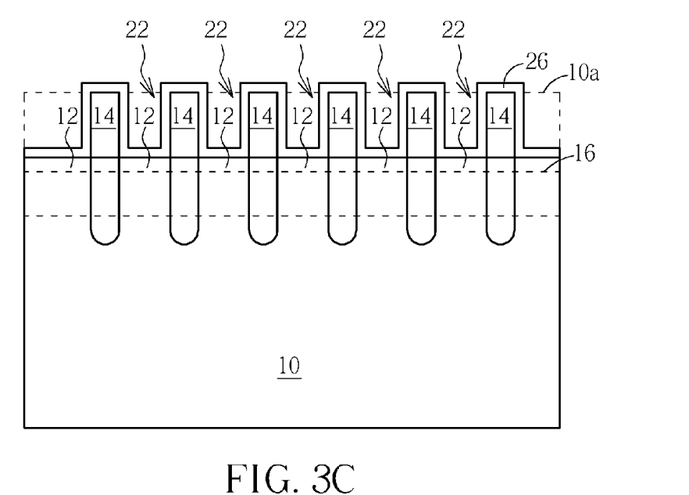

Please refer to FIGS. 3A, 3B and 3C. FIG. 3A is a top view of the schematic layout of the memory array of the memory device after the blanket formation of liner over the substrate according to the embodiment of the invention. FIGS. 3B and 3C are schematic, cross-sectional views taken along lines I-I' and II-II', respectively, in FIG. 3A. As shown in FIG. 3A, a thin layer of silicon nitride liner 26 is deposited over the substrate 10 in a blanket fashion. The silicon nitride liner 26 may be deposited using CVD or ALD methods. As can be seen in FIG. 3C, the silicon nitride liner 26 is deposited into the BDL trenches 22, but does not completely fill up the BDL trenches 22. The silicon nitride liner 26 conformally covers the protruding STI structures 14 and the top surface of the active areas 12.

Figure 4A:
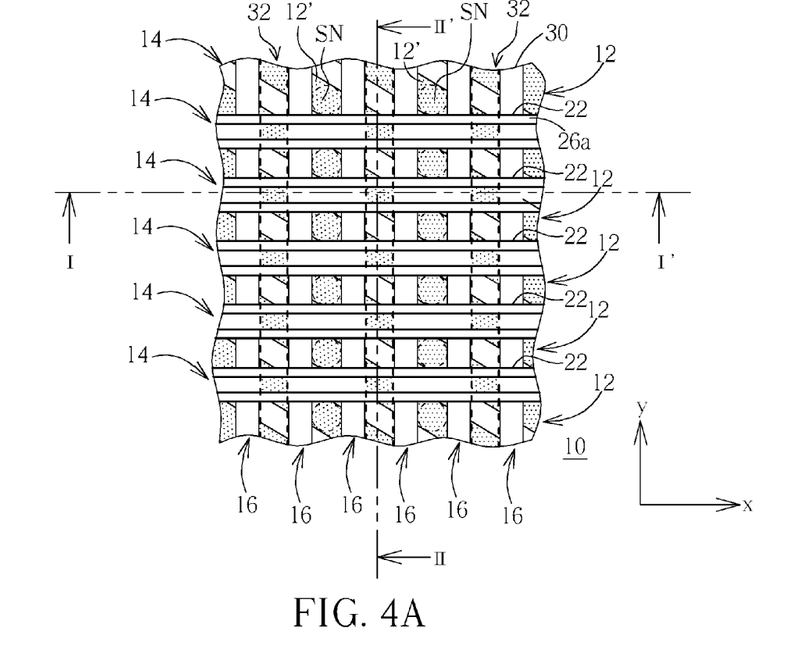
Figure 4B:
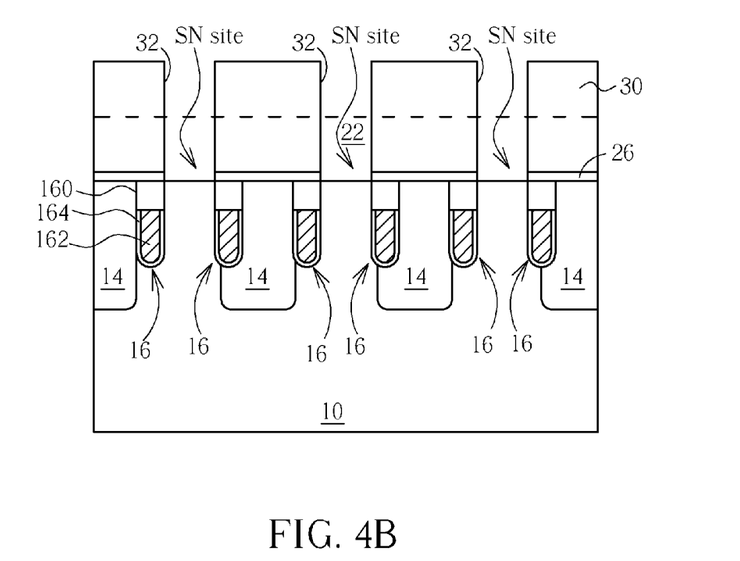
Figure 4C:
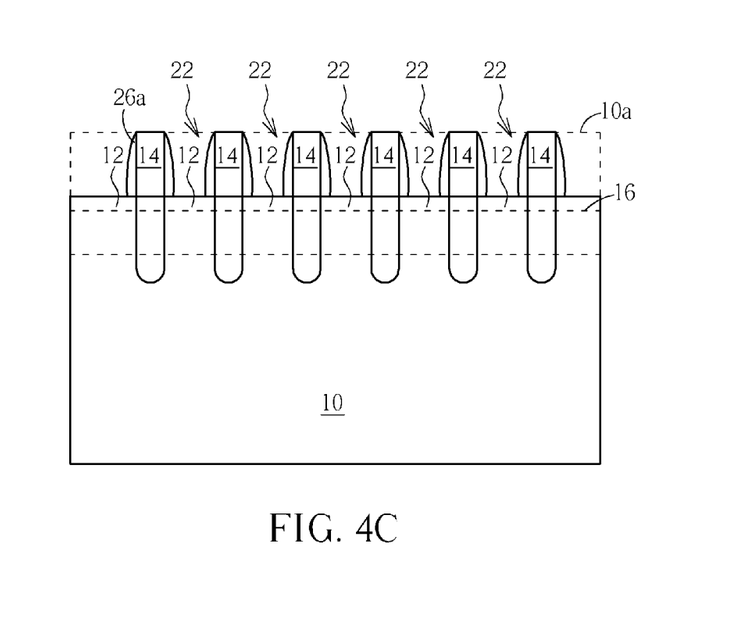

Please refer to FIGS. 4A, 4B and 4C. FIG. 4A is a top view of the schematic layout of the memory array of the memory device after the formation of storage node contact window according to the embodiment of the invention. FIGS. 4B and 4C are schematic, cross-sectional views taken along lines I-I' and II-II', respectively, in FIG. 4A. As shown in FIGS. 4A and 4B, a patterned photoresist layer 30 is formed on the substrate 10. The patterned photoresist layer 30 has columns of line-shaped openings 32 that expose a portion of the silicon nitride liner 26 within line-shaped areas between the columns of line-shaped buried word lines 16, which overlap with the SN sites. The patterned photoresist layer 30 may be formed using a cut mask and conventional lithographic processes. Using the patterned photoresist layer 30 as a hard mask, the exposed silicon nitride liner 26 may be etched and removed from the line-shaped openings 32, thereby exposing the active areas 12 at the SN sites, while the rest of the substrate surface remains covered with the silicon nitride liner 26. As can be seen in FIG. 4C, the exposed silicon nitride liner 26 may be anisotropically etched to leave silicon nitride spacers 26a on respective sidewalls of the upward protruding STI structures 14.

Figure 5A:
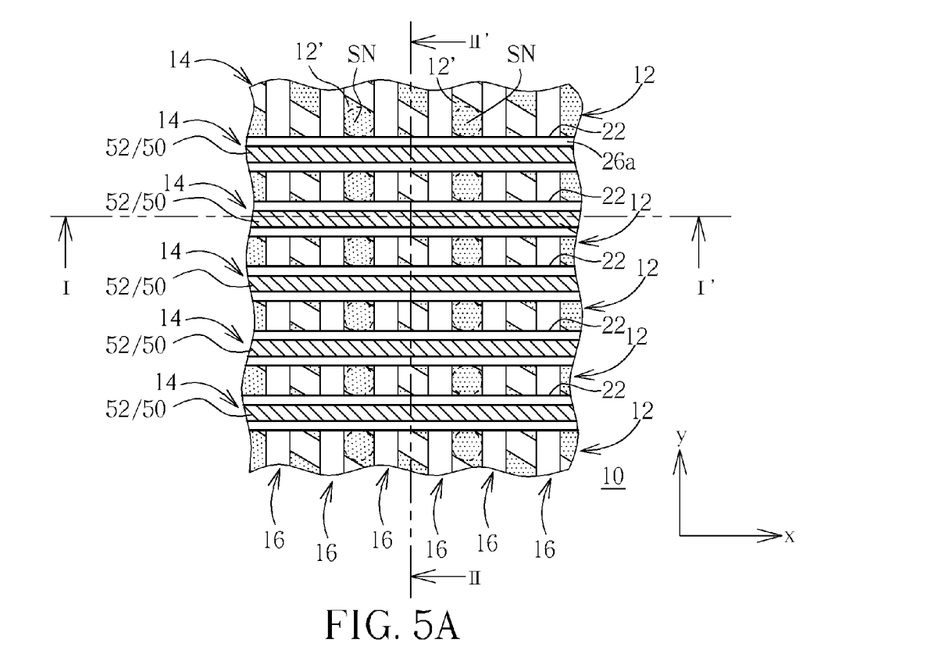
Figure 5B:
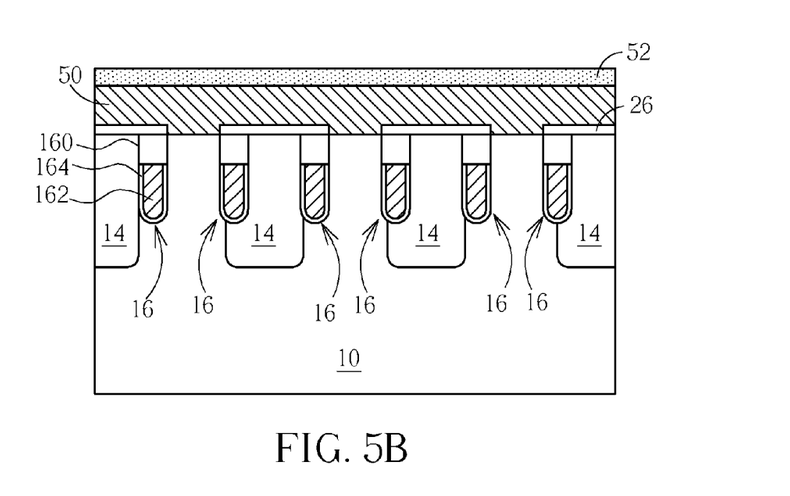
Figure 5C:
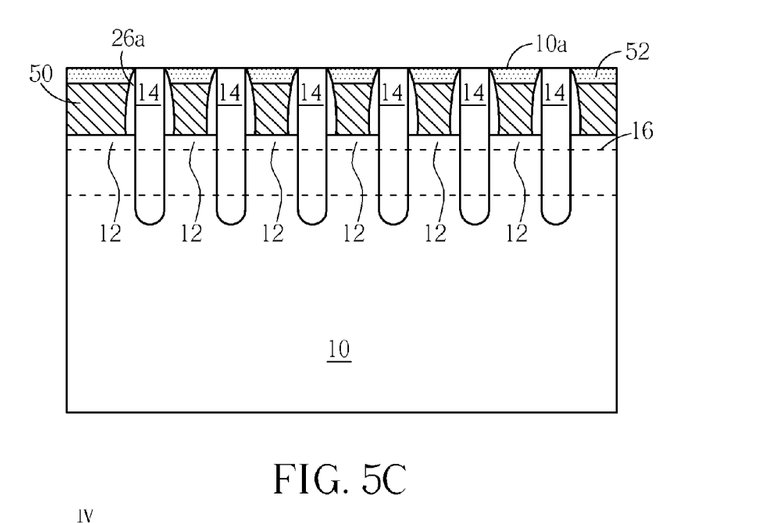

Please refer to FIGS. 5A, 5B and 5C. FIG. 5A is a top view of the schematic layout of the memory array of the memory device after the formation of buried digit lines and cap layer according to the embodiment of the invention. FIGS. 5B and 5C are schematic, cross-sectional views taken along lines I-I' and II-II', respectively, in FIG. 5A. As shown in FIGS. 5A-5C, a conductive layer (not shown) is deposited over the substrate 10. The conductive layer may include but not limited to polysilicon, silicide, titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof. The BDL trenches 22 are filled with the conductive layer. The conductive layer is then etched to recess the conductive layer into the BDL trenches 22, thereby forming buried digit lines 50. A dielectric cap layer 52, which is also referred to as "buried digit line cap" or "BDL cap"), is then used to insulate the recessed buried digit lines 50. For example, to form the dielectric cap layer 52, a blanket deposition of a dielectric layer (not shown) is performed. The deposited dielectric layer over the substrate 10 may be subjected to a planarization process such as a chemical mechanical polishing (CMP) to remove the dielectric layer outside the BDL trenches 22.

At this point, as best seen in FIG. 5C, the top surface of the dielectric cap layer 52 is substantially flush with the top surface 10a of the substrate 10 and presenting a substantial planar surface. Preferably, the dielectric cap layer 52 is made of a material that is different from the silicon nitride liner 26 to allow the subsequent process of storage node (SN) etch to be selective to the dielectric cap layer 52, while "less" selective to the silicon nitride liner 26. By doing this, the contact area for the storage node may be increased by exposing the sidewall of the AA landing area 12' after SN etch.

Figure 6A:
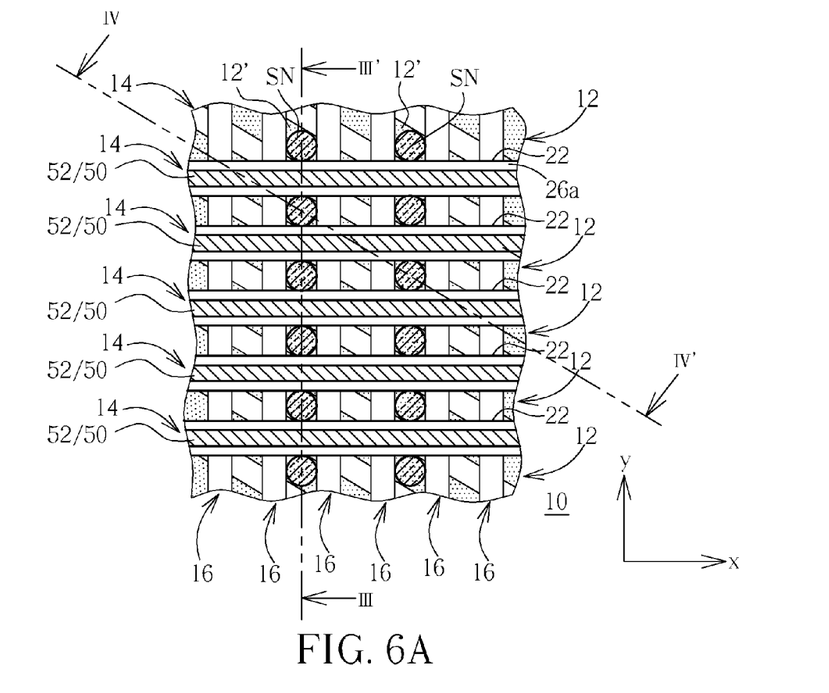
Figure 6B:
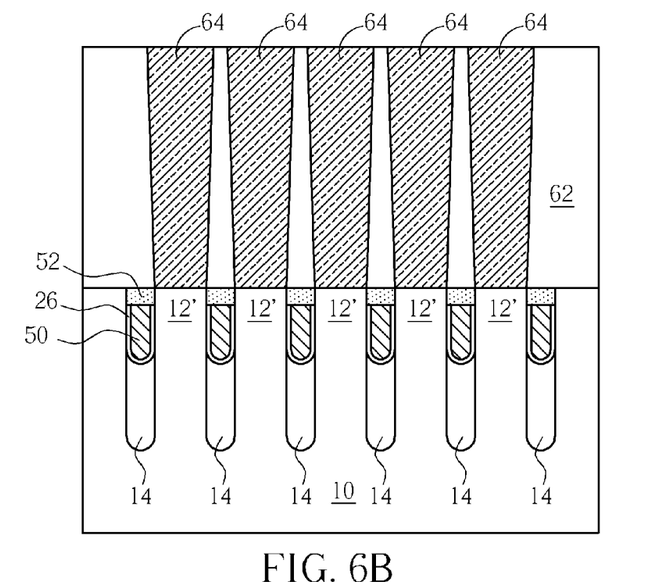
FIGS. 6B and 6C are schematic, cross-sectional views taken along lines III-III' and IV-IV', respectively, in the layout diagram depicted in FIG. 6A.
Figure 6C:
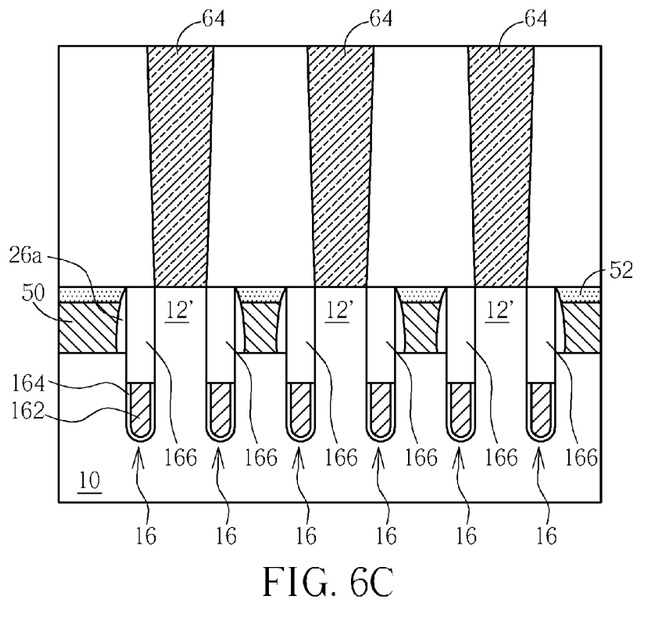
Figure 7:
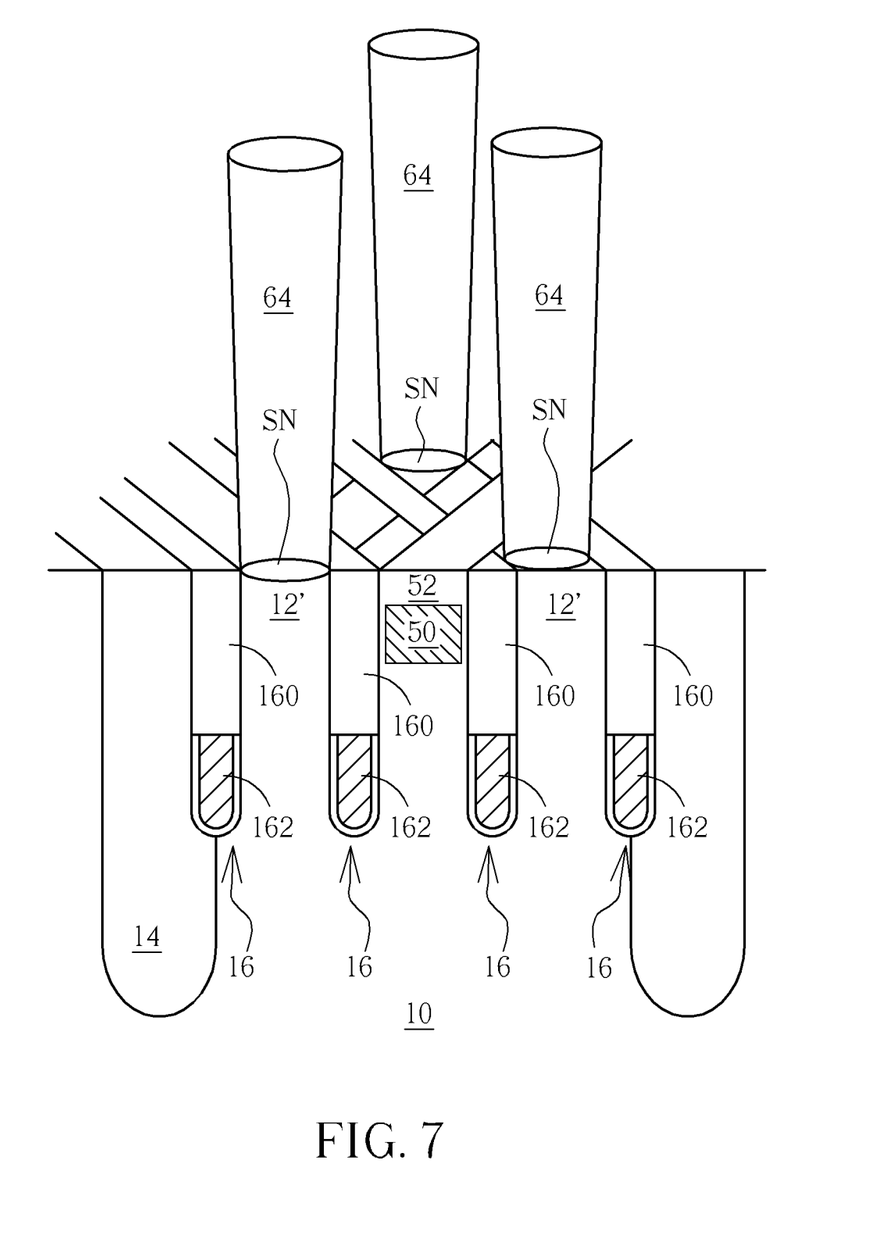
FIG. 7 is a schematic, perspective view showing a portion of the memory array of the memory device according to the embodiment of the invention.

Please refer to FIGS. 6A-6C and FIG. 7. FIG. 6A is a top view of the schematic layout of the memory array of the memory device after the formation of storage nodes according to the embodiment of the invention. FIGS. 6B and 6C are schematic, cross-sectional views taken along lines III-III' and IV-IV', respectively, in FIG. 6A. FIG. 7 is a schematic, perspective view showing a portion of the memory array of the memory device according to the embodiment of the invention.

As shown in FIGS. 6A-6C, after the formation of the buried digit line 50 and the dielectric cap layer 52, an insulating layer 62, such as a silicon oxide, is deposited over the substrate 10. Openings are then etched into the insulating layer 62. Each of the openings expose a portion of the SN sites along the line-shaped active areas 12. Conductive material such as polysilicon or metal is then deposited into the openings to form storage nodes 64.

To sum up, it is advantageous to use the present invention because the process steps for forming a storage node contact (or "cell contact") are omitted and therefore the fabrication process is simplified. The elimination of the cell contact also avoids the potential shorting issues including cell contact to bit line or cell contact to cell contact, and thus brings the benefits of increased margin for fabrication of the next-generation memory cell. In addition, the flattened substrate surface due to buried digit line configuration can maximize AA landing area for the storage node.

Those skilled in the art will readily observe that numerous modifications and alterations of the device and method may be made while retaining the teachings of the invention.

What is claimed is:

1. A method for fabricating a memory array, comprising:
   providing a semiconductor substrate having thereon a plurality of line-shaped active areas and intermittent line-shaped trench isolation regions between the plurality of line-shaped active areas, which extend along a first direction;
   forming buried word lines extending along a second direction in the semiconductor substrate, the buried word lines intersecting with the line-shaped active areas and the intermittent line-shaped trench isolation regions, wherein the second direction is not perpendicular to the first direction;
   forming buried digit lines extending along a third direction in the semiconductor substrate above the buried word lines, wherein the third direction is substantially perpendicular to the second direction; and
   forming storage nodes at storage node sites between the buried digit lines above the buried digit lines.

2. The method for fabricating a memory array according to claim 1 wherein forming buried digit lines extending along a third direction in the semiconductor substrate comprises:
   recessing line-shaped buried digit line trenches into the semiconductor substrate;
   blanket depositing a liner over the semiconductor substrate;
   removing a portion of the liner from where the line-shaped buried digit line trenches intersecting with the line-shaped active areas;
   depositing a conductive layer into the line-shaped buried digit line trenches; and
   capping the conductive layer by a dielectric cap layer.

3. The method for fabricating a memory array according to claim 2 wherein the buried digit line trenches does not expose the buried word lines.

4. The method for fabricating a memory array according to claim 2 wherein the liner is silicon nitride liner.

5. The method for fabricating a memory array according to claim 4 wherein the dielectric cap layer is made of a material that is different from the liner.

6. The method for fabricating a memory array according to claim 2 wherein the liner conformally covers a bottom and sidewalls of the buried digit line trenches.

7. The method for fabricating a memory array according to claim 2 wherein after removing a portion of the liner, spacers are formed on sidewalls of the line-shaped trench isolation regions within the buried digit line trenches.

8. The method for fabricating a memory array according to claim 1 wherein the buried word lines intersect with the intermittent line-shaped active areas and line-shaped trench isolation regions at an acute angle θ.

9. The method for fabricating a memory array according to claim 8 wherein the acute angle θ ranges between 15°-60°.

10. The method for fabricating a memory array according to claim 1 wherein the storage node sites are exposed surface of the line-shaped active areas.

11. A memory array, comprising:
    a semiconductor substrate having thereon a plurality of line-shaped active areas and intermittent line-shaped trench isolation regions between the plurality of line-shaped active areas, which extend along a first direction;
    buried word lines extending along a second direction in the semiconductor substrate, the buried word lines intersecting with the line-shaped active areas and the intermittent line-shaped trench isolation regions, wherein the second direction is not perpendicular to the first direction;
    buried digit lines extending along a third direction in the semiconductor substrate above the buried word lines, wherein the third direction is substantially perpendicular to the second direction; and
    storage nodes at storage node sites between the buried digit lines above the buried digit lines.

12. The memory array according to claim 11 wherein the buried word lines intersect with the intermittent line-shaped active areas and line-shaped trench isolation regions at an acute angle θ.

13. The memory array according to claim 12 wherein the acute angle θ ranges between 15°-60°.

14. The memory array according to claim 11 wherein the storage node sites are exposed surface of the line-shaped active areas.

* * * * *